(12) United States Patent
Kreifeldt et al.

(10) Patent No.: US 8,054,993 B1
(45) Date of Patent: Nov. 8, 2011

(54) SYSTEM FOR AUTOMATIC COMPENSATION OF LOW FREQUENCY AUDIO BASED ON HUMAN LOUDNESS PERCEPTUAL MODELS

(75) Inventors: Richard Allen Kreifeldt, Sandy, UT (US); Timothy Shuttleworth, Woodland Hills, CA (US); Curtis Rex Reed, Salt Lake City, UT (US)

(73) Assignee: Harman International Industries, Incorporated, Northridge, CA (US)

( * ) Notice: Subject to any disclaimer, the term of this patent is extended or adjusted under 35 U.S.C. 154(b) by 1254 days.

(21) Appl. No.: 10/853,828

(22) Filed: May 26, 2004

Related U.S. Application Data

(60) Provisional application No. 60/552,840, filed on Mar. 13, 2004.

(51) Int. Cl.
*H03G 5/00* (2006.01)
*H04R 29/00* (2006.01)

(52) U.S. Cl. ............ 381/101; 381/56; 381/98; 381/103

(58) Field of Classification Search .............. 381/98, 381/99, 100, 101, 102, 103, 55, 56, 57–59, 381/316
See application file for complete search history.

(56) References Cited

U.S. PATENT DOCUMENTS

| | | | |
|---|---|---|---|
| 4,661,851 A | 4/1987 | Muterspaugh | |
| 4,739,514 A | 4/1988 | Short et al. | |
| 4,809,338 A | 2/1989 | House | |
| 5,172,358 A * | 12/1992 | Kimura | 369/47.26 |
| 5,172,417 A | 12/1992 | Iwamura | |
| 5,359,665 A | 10/1994 | Werrbach | |
| 5,361,381 A | 11/1994 | Short | |
| 5,812,687 A | 9/1998 | Onetti et al. | |
| 6,118,879 A | 9/2000 | Hanna | |
| 7,058,188 B1 * | 6/2006 | Allred | 381/107 |

* cited by examiner

*Primary Examiner* — Vivian Chin
*Assistant Examiner* — Douglas Suthers
(74) *Attorney, Agent, or Firm* — The Eclipse Group LLP

(57) ABSTRACT

A system for boosting the bass of an audio signal to closely match or mirrors a plurality of Robinson-Dadson loudness curves by interpolating coefficients from a table of values representing the Robinson-Dadson loudness. The system having a controller that interpolates the coefficients from the loudness curves and then uses the coefficients in a shelf filter that makes adjustments to the audio signal. The result of the adjustments to the audio signal is the introduction of bass boost slowly through a diminuendo or lowering of level through volume adjustment and to removes the bass boost rapidly during a crescendo or increase in level through user volume adjustment.

27 Claims, 6 Drawing Sheets ered to as Robinson-# SYSTEM FOR AUTOMATIC COMPENSATION OF LOW FREQUENCY AUDIO BASED ON HUMAN LOUDNESS PERCEPTUAL MODELS

RELATED APPLICATIONS

This application claims priority under 35 U.S.C. §119(e) of U.S. Provisional Patent Application No. 60/552,840, filed on Mar. 13, 2004 and titled "SYSTEM AND METHOD FOR VARYING LOW AUDIO FREQUENCIES WITH INTERPOLATED COEFFICIENTS", and is incorporated by reference in its entirety into this application.

BACKGROUND OF THE INVENTION

1. Field of the Invention

This application relates generally to audio signals and more practically to boosting the bass content in an audio signal.

2. Related Art

The results of Fletcher's and Munson's research, known as the Fletcher-Munson curves are well known in the art and generally teach that as the level of an audio signal is lowered, the responsiveness of the human ear decreases. The results indicate that at lower volume levels, the human ear is less able to hear the lower frequencies (i.e. bass) in the sound. Presently, many audio systems utilize a manual loudness control to boost low and high-end response at low volume levels to compensate for the responsiveness of the human ear.

In FIG. 1, an illustration of a set of frequency domain relative level curves 100 commonly referred to as Robinson-Dadson curves is shown. The Robinson-Dadson curves are the result of more recent studies of how the human ear perceives sound and builds upon the original curves developed by Fletcher and Munson in the early 1930's. These frequency domain relative level curves (equal loudness contours) relate to the frequency response of a human ear to the level of signals being heard. As the signal level decrease, research shows that the responsiveness to the signal by the human ear changes as the bass frequencies decrease.

In FIG. 2, a set of frequency domain relative level curves 200 illustrates the results from the Robinson-Dadson curves for loudness from 10-90 dB relative to the 90 phon curve. The loudness for 10-90 dB is shown with nine curves at 10 dB, 20 dB, 30 dB, 40 dB, 50 dB, 60 dB, 70 dB, 80 dB, and 90 dB. The 90 dB reference for the Robinson-Dadson curves shows that as the loudness decreases below 90 dB that it is desirable to boost the low frequencies.

A known approach to improving the perceived sound quality was proposed in House et al. (U.S. Pat. No. 4,809,338) and implements a bass contour network circuit that is coupled to the program source material. The House et al. patent describes a frequency contour circuit in which the transfer function from source to loudspeaker is altered by a complex attenuation network based on the transfer function of audio reproduction within an automobile. The House et al. patent adds boost to bass frequencies by this approach but the results bare little relationship to Robinson-Dadson curves of FIG. 2. In addition, the House et al. patent measures the signal level at the loudspeaker and thus operates in a feedback mode such that adjustments to the signal frequency content affect the measured signal level forming a servo loop. The House et al. patent uses a passive attenuation system that in reality attenuates mid and high frequencies at low volume levels and fails to describe how to restore that lost signal level and uses an average signal level. Other variants on this scheme utilize notch filters for equalizing the frequency resonance within a bounded area, such as a vehicle's interior. These other variants also use a feedback circuit to detect and adjust bass levels.

In another approach, proposed in the Short et al. patents (U.S. Pat. Nos. 4,739,514 and 5,361,381) circuits are implemented that provide automatic loudness compensation to boost the signal in a bandpass centered at 60 Hz through a circuit that utilizes a 2:1 compressor so that input signals can be compressed, filtered, then re-summed into the forward signal path. Similarly, the Werrbach patent (U.S. Pat. No. 5,359,665) describes a low pass filtered signal applied to a compressor and re-summed into the main signal path. Hence both the Short et al. patent and the Werrbach patent responds only to the signal level in the filtered signal path not the full range signal level.

In the Kimura patent (U.S. Pat. No. 5,172,358), a multiple pass band control scheme is used. In that scheme, the frequency bands are individually processed. Each frequency band is filtered and the level within the frequency band is detected. The detected level within the frequency band is then used to control the boost level applied to that frequency band using a variable boost limited to that frequency band. Contrary to the Fletcher-Munson curves and the Robinson-Dadson curves, the Kimura patent treats loudness as a concept that applies not to the full audible frequency band of the reproduced signal but to sub-bands at both high and low frequencies.

The Iwamura patent (U.S. Pat. No. 5,172,417) describes a three band equalizer that is computed and applied based on reproduced acoustic signal level and applies individual band equalization sections in fixed increments. The Iwamura patent also uses a feedback scheme in which the equalization applied is included in the measured signal that creates a servo-loop in which the compensation chases itself. Further, all these approaches only attempt to simulate the general trend of the Robinson-Dadson curves of FIG. 1 and FIG. 2.

These circuits and other known circuits do not mimic the Robinson-Dadson curves and therefore are not accurately responsive to what a listener can hear. Accordingly, there is a need for a circuit that automatically compensates for the decrease in perceived sound levels at lower volumes by mimicking the Robinson-Dadson curves.

SUMMARY

The system introduces bass boost slowly through a diminuendo or lowering of level through volume adjustment and to removes the bass boost rapidly during a crescendo or increase in level through user volume adjustment. This is done in such a way so that a listener may not notice the boosting action as the volume level is reduced. The changes in audio signals are achieved so that as the volume level or loudness rise, no damage to the audio equipment occurs.

A number of parameters associated with curves, such as the Robinson-Dobson curves and are stored in a memory readable by a controller. Each curve has associated coefficients that may be used to adjust a filter that controls the loudness of the lower frequencies of the audio signal. The Robinson-Dadson curves may be closely approximated or mirrored by interpolation between the parameters of at least two curves stored in memory. The interpolation may be used to derive coefficients that result in the filter being configured so the resulting audio signal closely approximate or mirrors the Robinson-Dadson curve.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION OF THE PREFERRED EMBODIMENTS

Figure 3:
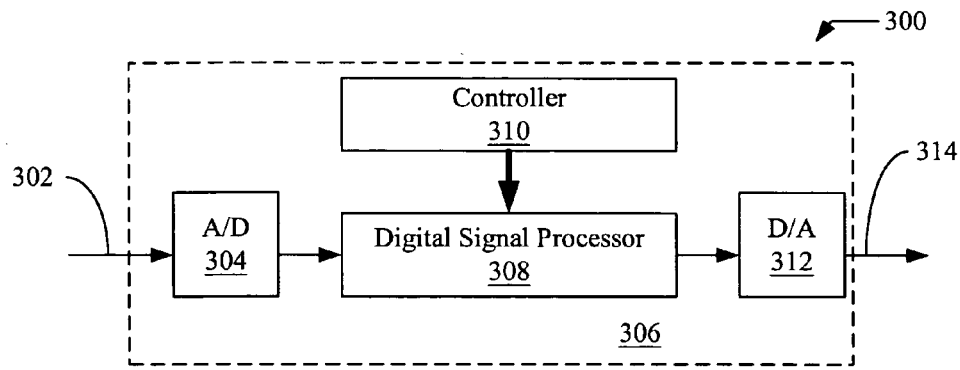
FIG. 3 is a block diagram of audio signal processing.

FIG. 3 is a block diagram 300 of audio signal processing. The audio signal 302 is received at an analog-to-digital (A/D) converter 304. The A/D converter 304 converts the analog audio signal 302 into a digital signal that is received by the control logic block 306 at the digital signal processor (DSP) 308. The DSP 308 is in data communication with a controller 310 that also resides in the control logic block 306. The DSP 308 may be implemented as a traditional DSP, a microprocessor, application specific integrated circuit, a circuit that functions as a state machine or any combination of the above listed devices.

The controller 310 may receive input from a user interface (not shown) that affects the processing of the input audio signal, such as threshold values and ratio parameters. The received input is then passed to the DSP 308 where the parameters are stored and used. In an alternate implementation, the DSP 308 may implement the functionality of the controller 310 and receive inputs directly from the user interface.

The DSP 308 modifies the loudness of the low frequency or bass portion of the digital signal in a way that closely matches or mirrors the Robinson-Dadson curves. The DSP 308 interpolating between stored values of the Robinson-Dadson curves accomplishes the mirroring of the Robinson-Dadson curves. The resulting digital signal from the digital signal processor 308 (and hence the control logic block 306) is received at a digital-to-analog (D/A) converter 312. The D/A converter 312 then converts the digital signal back to an output analog signal 314. Thus, the processing of the audio signal occurs in the digital domain. The A/D converter 304 and the D/A converter 312 may be implemented within the control logic block 306.

In other implementations, the processing of the audio signal may occur in the analog domain with the control signals occurring in the digital domain. In yet other implementations, the parameters of curves stored in the DSP 308 may be Robinson-Dadson curves, Fetcher-Munson curves, or other parameters that model how the human ear perceives sound. The Robinson-Dadson curves are the result of more recent studies of how the human ear perceives sound, but other curves such as Fletcher-Munson curves may be employed.

Figure 4:
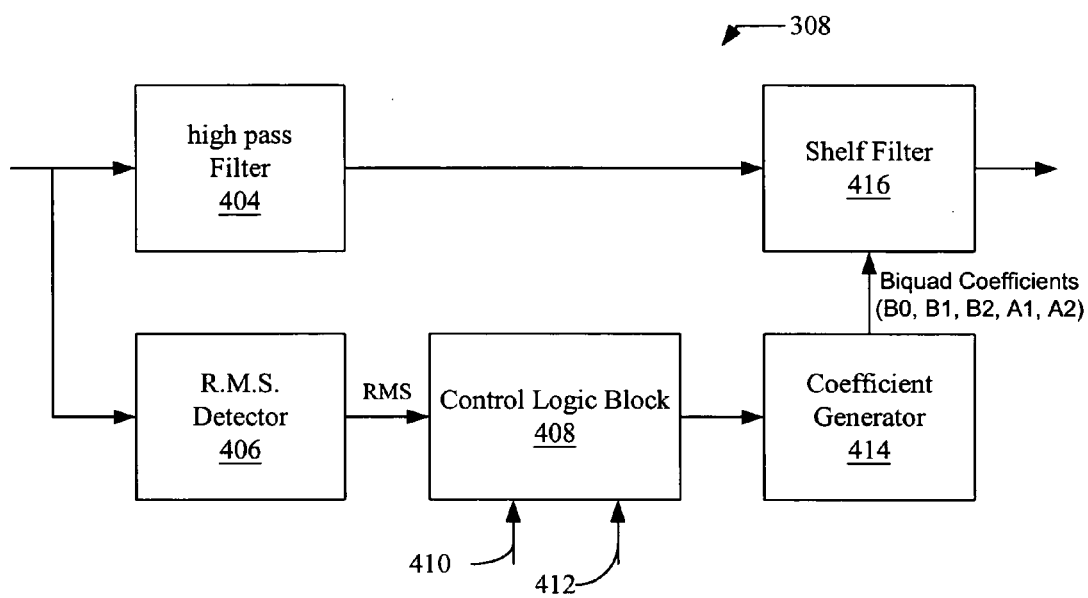
FIG. 4 is a block diagram of the DSP of FIG. 3.

FIG. 4 illustrates a block diagram of the DSP 308 of FIG. 3. The audio signal arrives at a high pass filter 404 and the root mean square (R.M.S.) detector 406. The audio signal is typically an alternating current (AC) voltage that carries the actual encoded signal. The output of the R.M.S. detector 406 may be in signal communication with the control logic block 408. The output of the control logic block 408 is shown in signal communication with a coefficient generator 414. The output of the high pass filter 404 is in signal communication with a shelf filter 416. The shelf filter 416 also receives coefficients from the coefficient generator 414 and outputs the processed audio signal.

The high pass filter 404 filters the audio signal and removes the frequencies below the frequency cut off of the high pass filter 404 from the audio signal. The high pass filter 404 may be a biquad high pass. In other implementations, other types of known high pass filters may be employed. The R.M.S. detector 406 also receives the input audio signal and determines a R.M.S. value that is a measurement of the voltage of the input audio signal.

The R.M.S. measurement value of the voltage of the input audio signal may be used as and indication of audio loudness because the R.M.S. value closely indicates the perceived volume level or acoustic power of the input audio signal. The R.M.S. detector 406 produces a direct current (DC) output voltage that is proportional to the R.M.S. level of the input audio signal's AC voltage.

The DC output voltage produced by the R.M.S. detector 406 is passed to the control logic block 408. The control logic block 408 processes the DC output voltage and converts it into a control parameter that is used to access the coefficient generator 414. The DC output voltage may be mapped to a digital value. Further, the control logic block 408 maintains the rate of application of boost (i.e. attack time) at a slower rate as relative to the release time (i.e. removal of boost). The threshold values 410 for applying the boost may be set by the user interface and stored in the control logic block 408. Similarly, the amount 412 or rate of boost may also be set by the user interface and stored in the control logic block 408.

The coefficients generated from the control parameter by the coefficient generator 414 are provided to the shelf filter 416. The coefficients may be generated by interpolating between the control parameters that are pluralities of values or coefficients that where previously stored or programmed into the memory. The stored pluralities of values or coefficients may represent curves, such as the Robinson-Dadson curves. In another implementation, a set of control parameters associated with a single data set, such as a curve may be stored and other data set derived from the first data set using mathematical equations with interpolation occurring between the two data sets. The shelf filter 416 may be implemented as a biquad shelf filter. The output of the shelf filter 416 may be the output audio signal 314.

Figure 5:
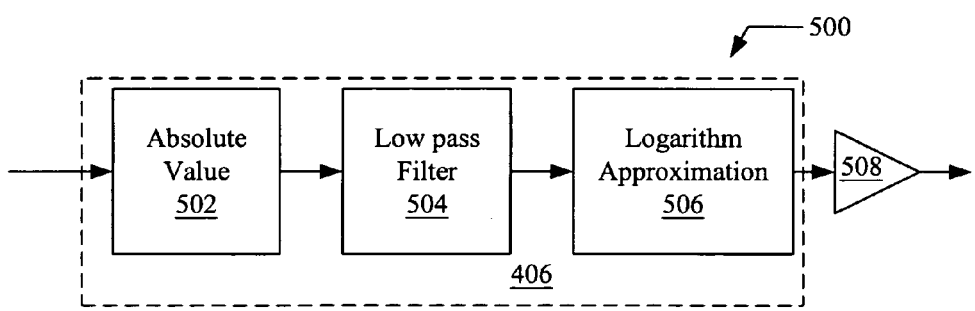
FIG. 5 is a block diagram of the R.M.S. detector of FIG. 4.

Turning to FIG. 5, a block diagram 500 of the R.M.S. detector 406 of FIG. 4 is shown. The R.M.S. detector 406 receives the input audio signal that may have a positive or negative DC voltage value. The absolute value block 502 takes the absolute value of the DC voltage value and determines the magnitude of the voltage of the input audio signal 302. If the signal has been converted to the digital domain, for example by the A/D 304, than in an alternate implementation the absolute value block 502 determines the magnitude of the received digital signal. The output of the absolute value block 502 is passed to a low pass filter 504.

The low pass filter 504 acts as an integrator for calculating the R.M.S. level. The logarithm approximation 506 processes the output of the low pass filter 504. The logarithm approximation 506 enables the signal strengths to be processed in the logarithmic log domain rather than in the linear domain. The R.M.S. output of the logarithm approximation 506 is passed through a scale block 508 and ultimately to the control logic block 408 of FIG. 4. The scale block is used to put a lower boundary on the logarithm so that the output of the R.M.S detector 406 has a minimum output.

Figure 6:
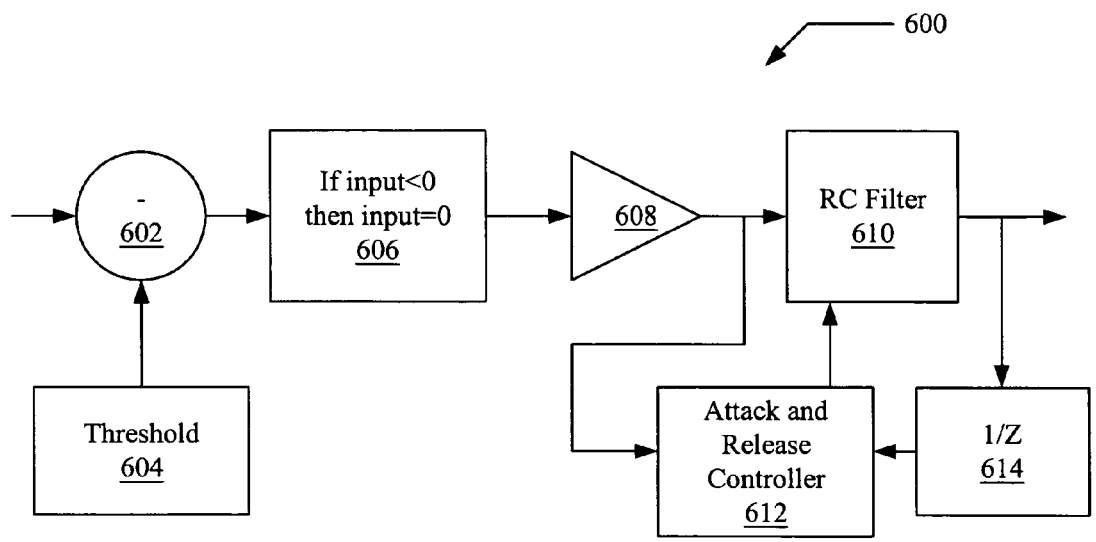
FIG. 6 is a block diagram of the attack and release circuit of the control logic block of FIG. 4.

In FIG. 6, a block diagram of the attack and release circuit 600 of the control logic block 408 of FIG. 4 is shown. The R.M.S. output is then received at the control logic block 408. A comparator 602 that compares a threshold value held in the threshold block 604 to the input from the R.M.S. output by subtracting the threshold value from the R.M.S. value. The threshold value block 604 provides the threshold value that may be set by a user interface via controller 310, FIG. 3. The threshold value contained in the threshold value block 604 assures that no changes to the low frequency (base) signal occurs if the R.M.S. output is above the threshold value. In other implementations, the threshold value may be hard coded in the threshold value block 604.

A determination is made if the input value is less than zero and if so, it is set to zero in block 606. The output of block 606 is then adjusted by a ratio set in a ratio block 608. The ratio is initial set by a user interface via controller 310, FIG. 3. The ration block 608 may have a hard coded ratio value in other implementations.

The adjusted output is then sent to a resistor-capacitor (RC) filter 610 and an attack and release controller 612. The attack and release controller 612 takes the difference of a control signal that is delayed by the sample delay 614 and the adjusted output. The resulting signal is then used to change the filter coefficients of the RC filter 610.

If the output of the RC filter 610 is greater than the input, then the attack and release controller 612 set the RC Filter 610 to one set of coefficients. If the output is less than the input then attack and release controller 612 set the RC filter 610 to another set of coefficients. This is how the timing of the adding and removing bass boost is controlled.

Figure 7:
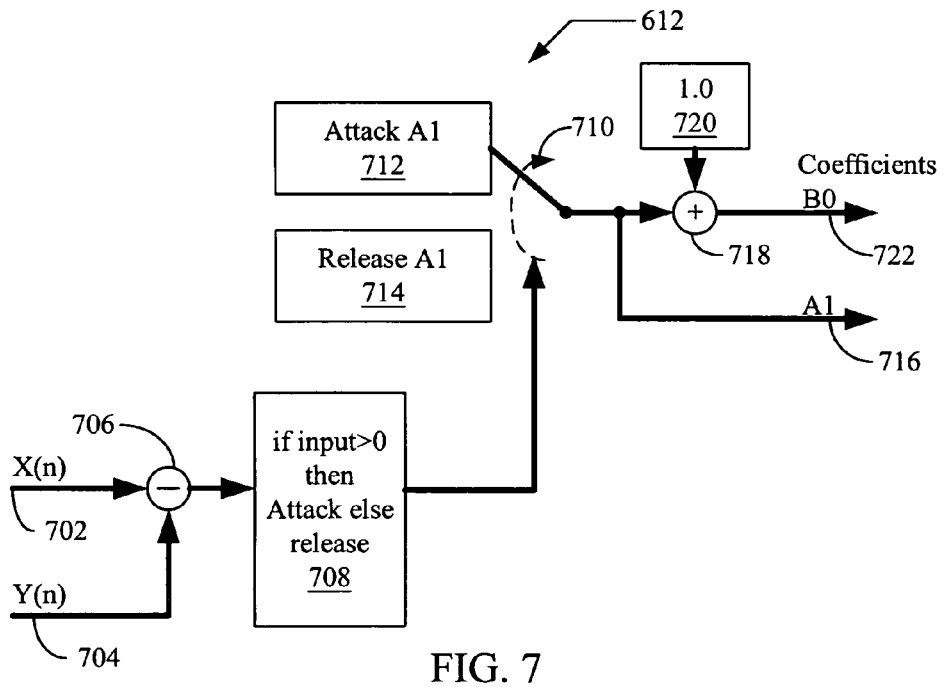
FIG. 7 is a block diagram of the attack and release block of FIG. 6.

Turning to FIG. 7 a block diagram of the attack and release controller 612 of FIG. 6 is shown. The attack and release controller 612 has at least two inputs that may include the adjusted output X(n) 702 and the control signal that is delayed by the sample delay 614 Y(n) 704. The delayed control signal is subtracted from the adjusted output X(n) 706. A switch control 708 checks to determine if the difference 706 between X(n) 702 and Y(n) 704 is greater than zero. If the difference 706 is greater than zero in the switch control 708 then an attack condition exist and switch 710 makes a connection with Attack A1 block 712 that enables the coefficients for the bass boost effect to be more slowly applied relative to the bass boost being removed. If the difference is not greater than zero, than a release condition exists and the switch control 708 makes a connection via switch 710 with the "Release A1" block 714 and the coefficients for the bass boost effect may result in the bass boost being rapidly removed. The resulting coefficients may be directly available as with A1 716 and may also be combined by a combiner 718 with a scaling value 720 resulting in a scaled coefficient B1 722. The switch 710 is shown as a electro-mechanical switch, but may be implemented by any means that provided for a selection between the attack A1 block 712 and the release A1 block 714, including relays, digital switches, and transistors to name but a few examples.

Figure 8:
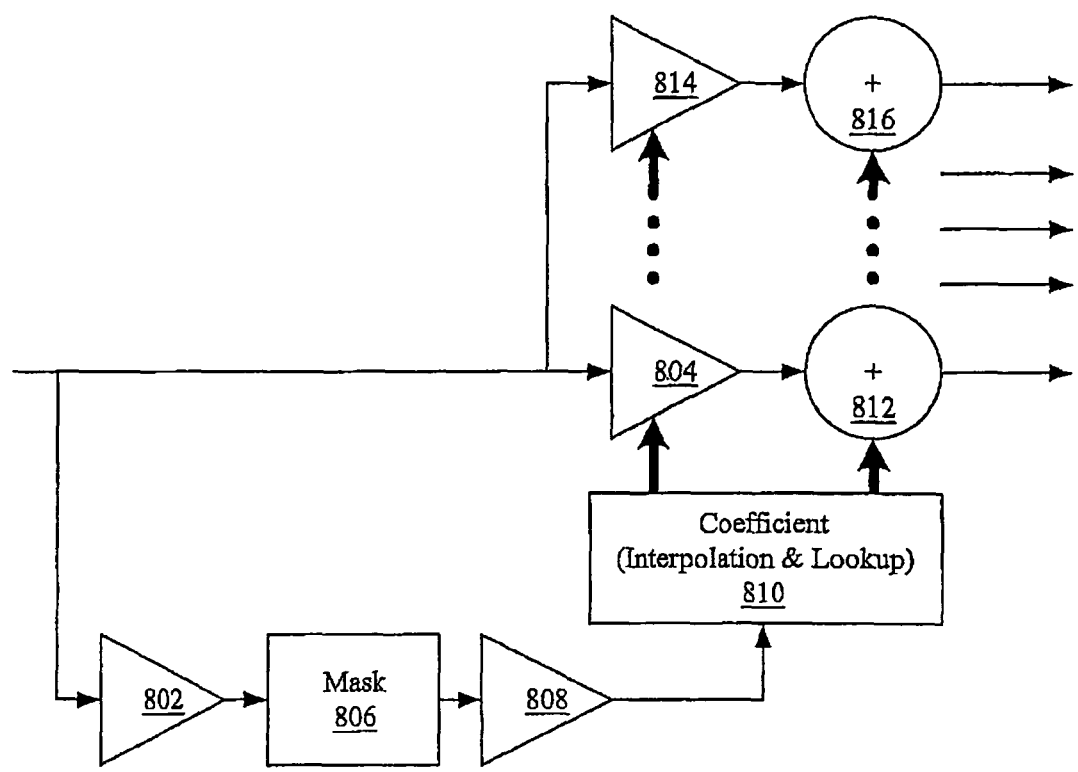
FIG. 8 is a block diagram of the coefficient generator of FIG. 4.

FIG. 8 is a block diagram of the coefficient generator 414 of FIG. 4. The coefficient generator 414 receives the control signal from control logic 408, FIG. 4. The control signal may then be scaled by a scaler 802 and passed to a mask 806.

The mask 806 in a fixed-point implementation has a mask of three ones with the rest of the byte being zero. This configuration of the mask 806 results in the most significant bits of the control word generating a number between zero and seven inclusive. In a floating-point implantation, the exponent of the scaled control signal results in the same outcome (a number between zero and seven inclusive). The output of the mask 806 is then shifted by shift block 808 to format the output of the mask into a lookup signal used to select the coefficients within the coefficient generator 810.

Figure 1:
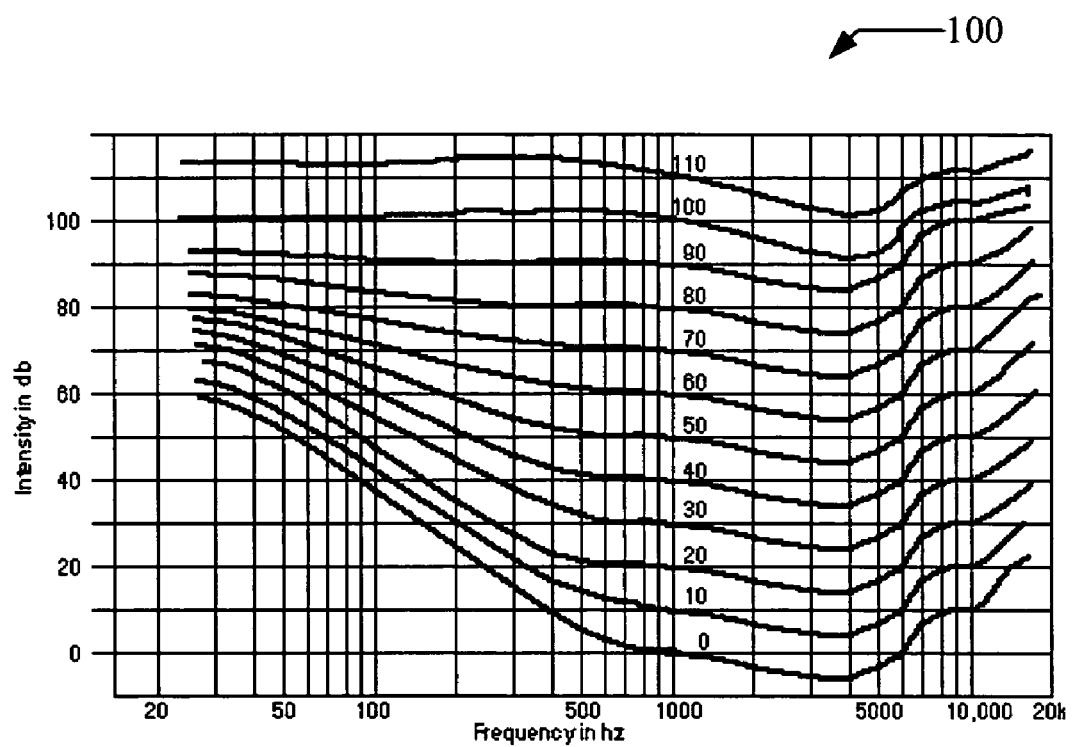
FIG. 1 is a frequency domain relative level diagram illustrating the Robinson-Dadson curves.
Figure 2:
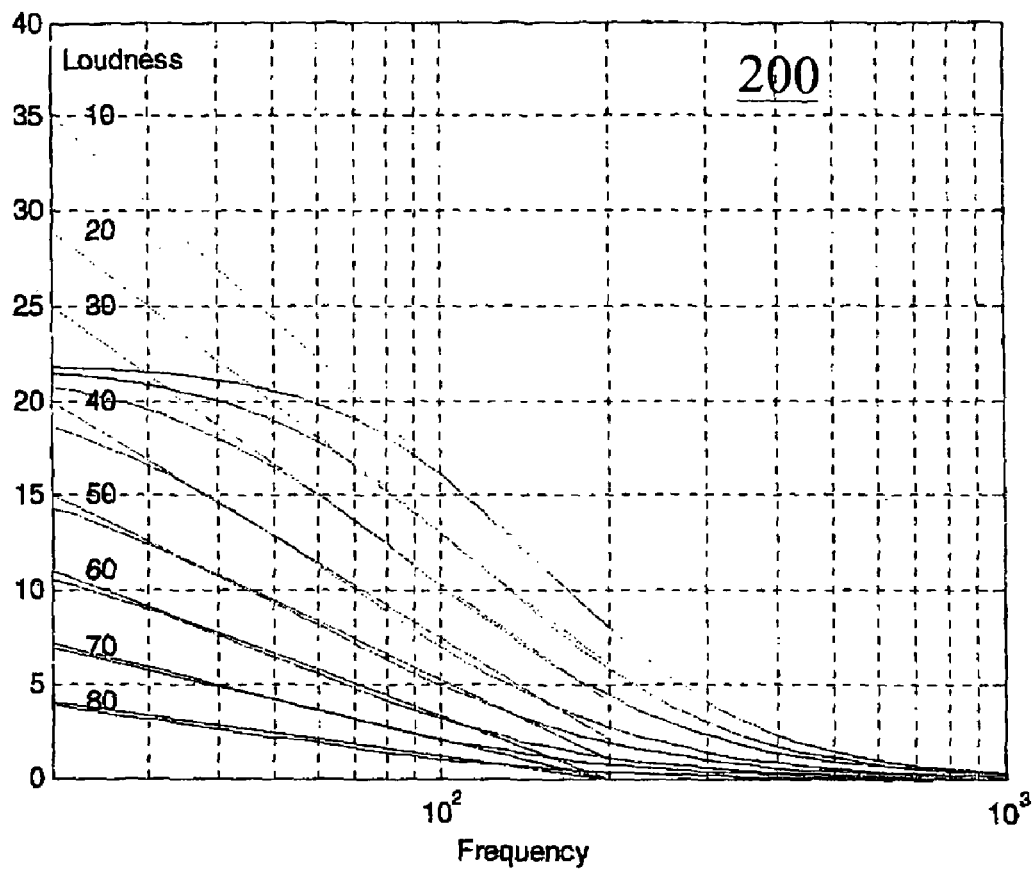
FIG. 2 is a frequency domain relative level diagram illustrating the Robinson-Dadson curves normalized at 1 KHz and relative to the 90 phon curve.

The lookup signal may not have coefficients that are directly accessible. In that case, an interpolation occurs within the coefficient generator 810 by an interpolator in order to derive coefficients. The coefficients in the lookup table of the coefficient generator 810 represent the relative loudness curves of FIG. 2. The coefficients that may be generated are associated with the 80 dB, 70 dB, 60 dB, 50 dB, and 40 dB levels. In other implementation, other coefficients may be generated or a different number of coefficients may be generated. Generally, two curves are used to determine the coefficients. Each coefficient is generated by the control signal be scaled 804, . . . , and 814 and combined 812, . . . , and 816 with the respective control signals. This scaling and combining may occur for each coefficient generated by the coefficient generator 810. The coefficients are than used by the shelf filter 416 of FIG. 4 to generate the output audio signal 314.

Figure 9:
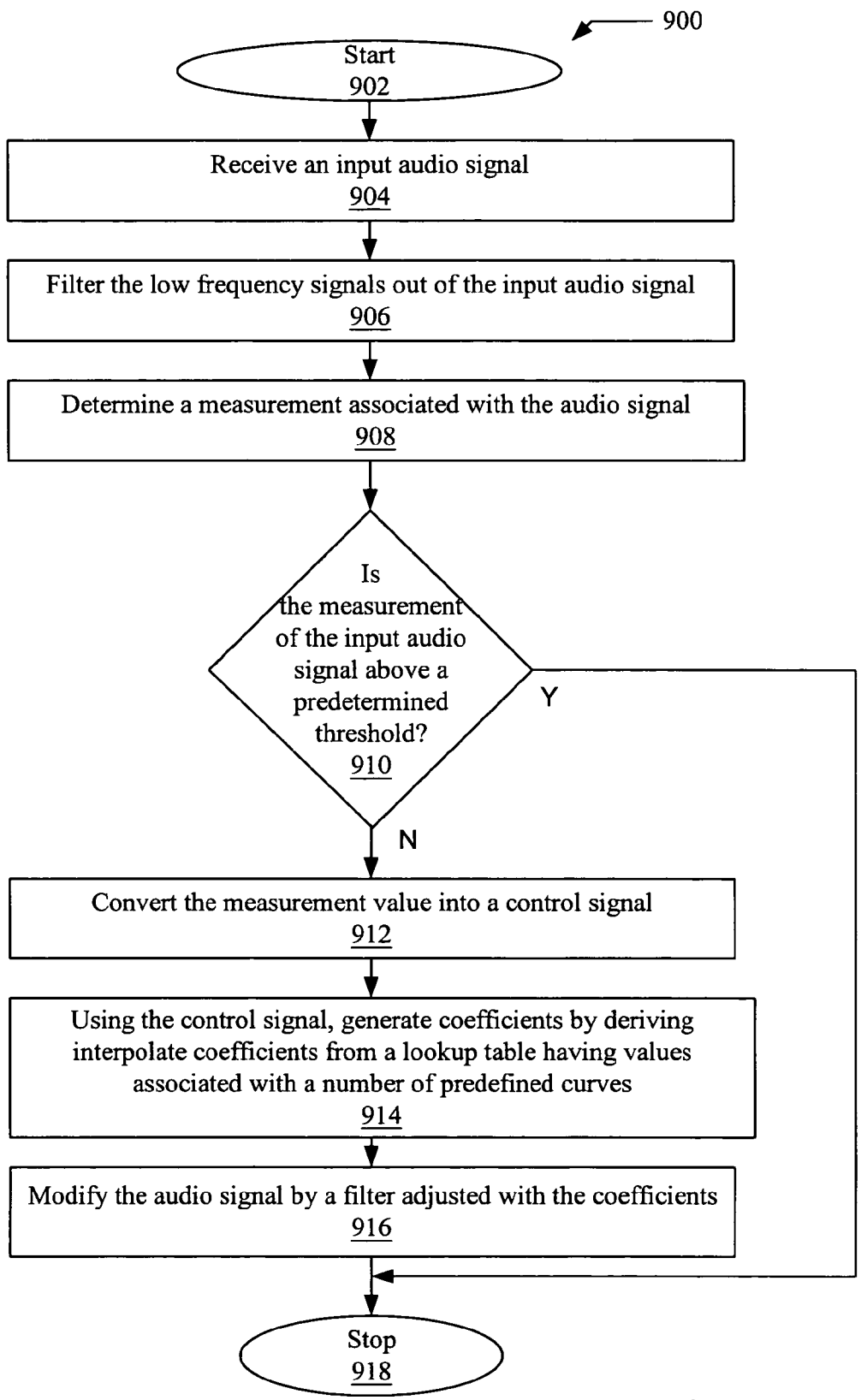
FIG. 9 is a flow diagram of audio signal control of FIG. 4.

In FIG. 9, a flow diagram 900 of the control logic of FIG. 4 is shown. The flow starts 902 with an input audio signal 904. The audio signal may then be filtered 906 by a high pass filter 404, FIG. 4, to remove the low frequency (bass) signals from the input audio signal. In other implementations, the high pass filter may not be used. The R.M.S. value of the input audio signal is determined 908 and a device such as a R.M.S. detector 406 may be employed.

A determination is made 910 if the input audio signal is above a predetermined threshold. The determination is used to decide if the low frequencies require adjusting. If the magnitude of the input audio signal is not above the threshold 910, then convert the magnitude into a control signal 912. The control signal is then used to interpolate coefficients from a lookup table that has values associated with a number of predefined curves 914. The predefined curves may be Robinson-Dadson loudness curves. The coefficients are then used to modify 916 a shelf filter 416. The shelf filter 416 in turn modifies the input audio signal by boosting the loudness of the bass and processing is complete 918. The attack time constant (rate of application of boost) may be slow with respect to the release time constant (rate of removal of boost).

If the magnitude of the input audio signal is above the predetermined threshold 910, then no modification of the input audio signal is needed and processing stops 918. Even though the processing is shown as stopping 918, in practice it may be implemented in a feedback loop and be a continuous process as long as and input signal is present.

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

We claim:

1. An apparatus that varies low audio frequencies in an audio signal, the apparatus comprising:
   a detector that determines a measurement associated with audio loudness of the audio signal along the full audible frequency band;
   a coefficient generator that generates a plurality of coefficients using the measurement and previously stored values according to at least one predetermined curve that models how the human ear perceives sound, the plurality of coefficients configured to effect a controlled adjustment of low frequency loudness when the measurement indicates a loudness adjustment; and
   a filter responsive to the coefficients from the coefficient generator, the filter being configured to process the audio signal along the full audible frequency band of the audio signal, to control adjustment of the loudness of the low audio frequencies in the audio signal, and to generate an adjusted audio signal that mirrors the at least one predetermined curve.

2. The apparatus of claim 1, where the at least one predetermined curve is either a Robinson-Dadson curve or a Fletcher-Munson curve.

3. The apparatus of claim 1, where the coefficient generator further comprises:
   a plurality of coefficients associated with a plurality of predetermined curves; and
   an interpolator that derives the plurality of coefficients by interpolating between stored values associated with at least two of the plurality of predetermined curves.

4. The apparatus of claim 1, further comprises:
   an attack and release controller, for controlling low frequency loudness adjustment, the attack and release controller having a first input of a value associated with the audio loudness and a second input of the adjusted audio signal that is time delayed and providing results in an output to the coefficient generator which generates a first set of coefficients if the first input is greater relative to the second input and a second set of coefficients if the first input is less relative to the second input.

5. The apparatus of claim 4, where a determination of the value associated with the audio loudness is the result of a root mean square detector.

6. The apparatus of claim 4, where the first set of coefficients result in bass boost of the lower frequencies being applied to the audio signal at a faster rate than the second set of coefficients removes bass boost.

7. The apparatus of claim 3, where the interpolator resides in a digital signal processor.

8. The apparatus of claim 1, where the filter is a shelf filter.

9. The apparatus of claim 1, where the detector is a root mean square detector.

10. An audio system that varies low audio frequencies in an audio signal, comprising:
    a receiver that receives the audio signal;
    a detector that determines a measurement associated with audio loudness of the audio signal along the full audible frequency band;
    a coefficient generator that generates a plurality of coefficients using the measurement and previously stored values according to at least one predetermined curve that models how the human ear perceives sound the plurality of coefficients configured to effect a controlled adjustment of low frequency loudness when the measurement indicates a loudness adjustment; and
    a filter responsive to the coefficients from the coefficient generator, the filter being configured to process the audio signal along the full audible frequency band of the audio signal, to control adjustment of the loudness of the low audio frequencies in the audio signal, and to generate an adjusted audio signal that mirrors the at least one predetermined curve.

11. The audio system of claim 10, where the at least one predetermined curve is either a Robinson-Dadson curve or a Fletcher-Munson curve.

12. The audio system of claim 10, where the coefficient generator further comprises:
    a plurality of coefficients associated with a plurality of predetermined curves; and
    an interpolator that derives the plurality of coefficients by interpolating between stored values associated with at least two of the plurality of predetermined curves.

13. The audio system of claim 10, further comprises an attack and release controller that has a first input of a value associated with the audio loudness and a second input of the adjusted audio signal that is time delayed and results in an output to the coefficient generator which generates a first set of coefficients if the first input is greater relative to the second input and a second set of coefficients if the first input is less relative to the second input.

14. The audio system of claim 13, where a determination of the value associated with the audio loudness is the result of a root mean square detector.

15. The audio system of claim 13, where the first set of coefficients result in a bass boost of the lower frequencies being applied to the audio signal at a faster rate than the second set of coefficients removes bass boost.

16. The audio system of claim 12, where the interpolator resides in a digital signal processor.

17. The audio system of claim 10, where the filter is a shelf filter.

18. The audio system of claim 10, where the detector is a root mean square detector.

19. A method for varying the low audio frequencies in an audio signal that contains low audio frequencies, comprising:
    detecting with a detector a measurement that is associated with audio loudness of the audio signal along the full audible frequency band;
    generating a plurality of coefficients from the measurement, the plurality of coefficients being generated using the measurement and previously stored values according to at least one predetermined curve that models how the human ear perceives sound, the plurality of coefficients configured to effect a controlled adjustment of low frequency loudness when the measurement indicates a loudness adjustment; and
    filtering the audio signal with a filter responsive to the coefficients from the coefficient generator, the filter being configured to process the audio signal along the full audible frequency band of the audio signal, to control adjustment of the loudness of the low audio frequencies in the audio signal, and to generate an adjusted audio signal that mirrors the at least one predetermined curve.

20. The method of claim 19, where the at least one predetermined curve is either a Robinson-Dadson curve or a Fletcher-Munson curve.

21. The method of claim 19, where generating further comprises:

accessing a plurality of coefficients associated with a plurality of predetermined curves; and deriving the plurality of coefficients by interpolating between stored values associated with at least two of the plurality of predetermined curves.

22. The method of claim 19, further comprises:

adjusting the audio signal in response to an attack and release controller that has a first input of a value associated with the audio loudness and a second input of the adjusted audio signal that is time delayed and results in an output to the coefficient generator which generates a first set of coefficients if the first input is greater relative to the second input and a second set of coefficients if the first input is less relative to the second input.

23. The method of claim 22, further comprising:
determining the value associated with the audio loudness uses a root mean square detector.

24. The method of claim 22, further comprising:
adjusting audio signal in response to the first set of coefficients by boosting the bass of the lower frequencies at a faster rate than the second set of coefficients removes the bass boost.

25. The method of claim 21, where the interpolator resides in a digital signal processor.

26. The apparatus of claim 19, where the filter is a shelf filter.

27. The apparatus of claim 19, where the detector is a root mean square detector.

* * * * *